United States Patent [19]

Fukunaga et al.

[11] 4,217,153
[45] Aug. 12, 1980

[54] METHOD OF MANUFACTURING SEMICONDUCTOR DEVICE

[75] Inventors: Shinobu Fukunaga; Akihiko Yasuoka, both of Itami, Japan

[73] Assignee: Mitsubishi Denki Kabushiki Kaisha, Tokyo, Japan

[21] Appl. No.: 892,861

[22] Filed: Mar. 31, 1978

[30] Foreign Application Priority Data

Apr. 4, 1977 [JP] Japan .................................. 52/38763
Apr. 13, 1977 [JP] Japan .................................. 52/42881

[51] Int. Cl.² ............................................ H01L 21/22
[52] U.S. Cl. .................................. 148/187; 148/1.5
[58] Field of Search .............................. 148/187, 1.5

[56] References Cited

U.S. PATENT DOCUMENTS

| | | | |
|---|---|---|---|
| 3,436,282 | 4/1969 | Shoda | 148/187 |
| 3,477,886 | 11/1969 | Ehlenberger | 148/187 |
| 3,959,025 | 5/1976 | Polinsky | 148/1.5 |
| 4,002,501 | 1/1977 | Tamura | 148/1.5 |
| 4,013,484 | 3/1977 | Boleky et al. | 148/1.5 |
| 4,023,195 | 5/1977 | Richman | 148/1.5 |
| 4,043,848 | 8/1977 | Bazin | 148/187 |

*Primary Examiner*—G. Ozaki

*Attorney, Agent, or Firm*—Wenderoth, Lind & Ponack

[57] ABSTRACT

In the manufacture of a field-effect transistor, a silicon nitride film (underlaid with a thin silicon oxide film) is selectively formed on those parts of a semiconductor substrate of a first conductivity type at which a gate region and source and drain electrodes are to be formed, the formation of the source and drain regions and subsequently the formation of a selective thermal oxidation film on the source and drain regions are carried out by employing the silicon nitride film as a mask, and thereafter, the silicon nitride film is removed and the contacts are selectively formed at the exposed parts.

Further, this invention extends to the manufacture of a C-MOS integrated circuit device which exploits the SOP (Selective oxidation process) technique employing an oxidation-proof film.

According to this invention, there are provided a novel method of manufacture which reduces the problem of disconnection of electrode interconnections, which promotes the fineness of a pattern based on self-alignment and which reduces the capacitance between source and drain electrodes thereby to achieve a high-speed operation.

1 Claim, 29 Drawing Figures

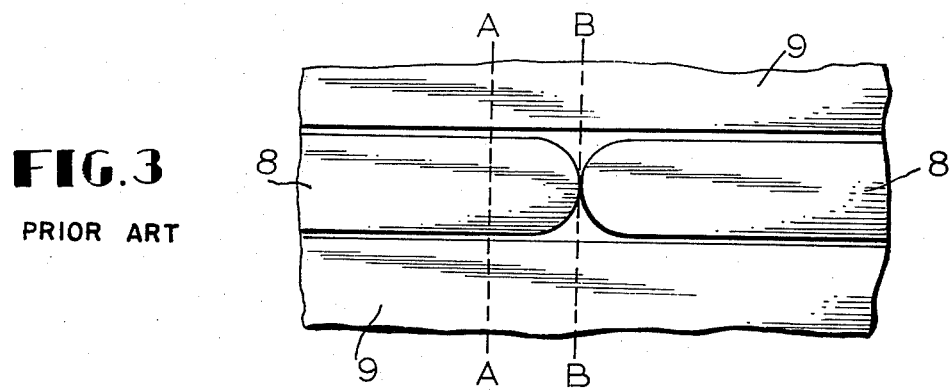
FIG.3 PRIOR ART
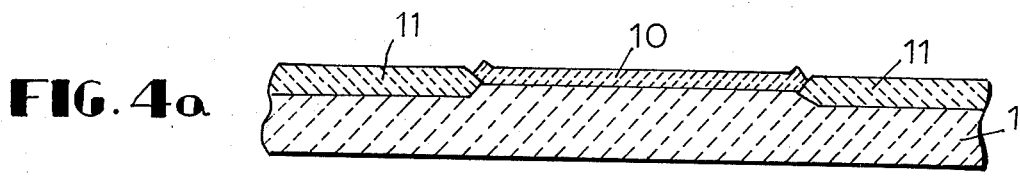
FIG.4a
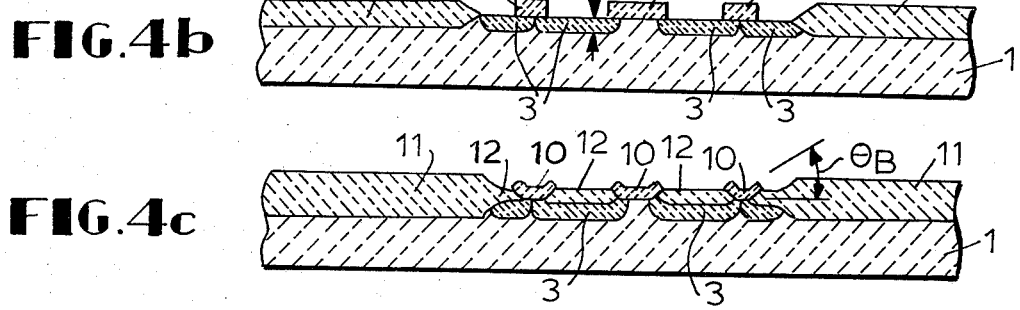
FIG.4b
FIG.4c
FIG.4d

METHOD OF MANUFACTURING SEMICONDUCTOR DEVICE

BACKGROUND OF THE INVENTION

This invention relates to a method of manufacturing a semiconductor device. More particularly, it relates to improvements in a method of bonding a metallic interconnection to a semiconductor region through an opening in an oxide film deposited on the semiconductor region.

As an integrated circuit becomes higher in density and larger in scale, the production of acceptable circuits becomes lower. In this regard, the problem of disconnection especially during the formation of a metallic interconnection is a serious factor. The metallic interconnection is usually made of aluminum (Al), and is formed in such a way that after depositing aluminum by vacuum evaporation or sputtering, it is etched into a required pattern by photolithography. At this time, it often occurs that the aluminum is not deposited in a film of uniform thickness at a stepped part of the pattern. In addition, the deposited aluminum is sometimes lost at the stepped part during the course of forming the pattern. Since, in general, these difficulties are more serious the larger the level difference of the stepped part, there has been proposed that the level difference of a stepped part be reduced and that a stepped part having a gentle slope be formed.

Now, a prior-art method will be described using a P-channel Al-gate MOS FET as an example. FIGS. 1(a) to 1(c) are vertical sectional views which show a part of a semiconductor wafer during the essential steps of a prior-art method of forming openings for contact and metallic interconnections.

As shown in FIG. 1(a), a silicon oxide film (SiO$_2$ film) 2 is formed on a selected area of a silicon single-crystal substrate 1 of the N-conductivity type. Thereafter, the substrate is heated in an atmosphere containing diborane (B$_2$H$_6$), to diffuse boron thereinto and to form source and drain regions of the P-conductivity type 3. Subsequently, as shown in FIG. (b), a thick SiO$_2$ film 4 is formed on the semiconductor substrate 1 after removing the SiO$_2$ film 2. Further, openings 5 for bonding metallic interconnections to the source and drain regions 3 and an opening 6 for forming a gate insulating film and for connecting an Al interconnection with the gate insulating film are provided in the SiO$_2$ film 4 by the photolithographic etching. Subsequently, as shown in FIG. 1(c), the gate insulating film 7 is formed on that part of the semiconductor substrate 1 which is exposed through the opening 6. Thereafter, Al is deposited onto those parts of the source and drain regions 3 which are exposed through the openings 5, onto the gate insulating film 7 and onto the SiO$_2$ film 4, and it is patterned into a required shape so as to form the metallic interconnections 8. Thus, the semiconductor wafer of the P-channel Al-gate MOS FET is completed.

FIGS. 2(a) and 2(b) are enlarged sectional views each showing the state of the Al interconnection 8 at the source or drain region 3.

Ordinarily, those end parts of the SiO$_2$ film 4 which face the opening for the source or drain region 3 have a steep slope as shown in these figures. As illustrated in FIG. 2(a), the thickness $t_1$ of the Al interconnection 8 overlying the end part of the SiO$_2$ film 4 is less than the thickness $t_2$ of the Al interconnection 8 overlying a flat part of the SiO$_2$ film 4. In some cases, the Al interconnection 8 becomes broken as illustrated in FIG. 2(b).

FIG. 3 is a plan view in which the portion shown in FIG. 2(a) is seen from the side of the metallic interconnection. Lines A and B in FIG. 3 correspond to points A and B in FIG. 2(a), respectively. Numeral 9 designates a photoresist film. In the step of the selective removal of the deposited Al for forming the pattern of the Al interconnections 8, a constriction often develops in the Al interconnection 8 as shown in FIG. 3.

The breaking and constriction of the Al interconnections 8 are attributed to the fact that the end parts of the SiO$_2$ film 4 facing the opening have an abrupt inclination. To moderate the effect of such a steep stepped part, there has heretofore been proposed a method in which an SiO$_2$ film is highly doped with phosphorus to reduce the inclination. With this method, however, it is difficult to obtain a small opening. Another disadvantage is that, since a high-temperature treatment at above 1,050° C. is required, the diffusion of the impurity proceeds rapidly.

SUMMARY OF THE INVENTION

It is an object of this invention to provide an improved method of manufacturing a semiconductor device.

Another object of this invention is to provide an improved method of manufacturing a semiconductor device which can prevent electrode interconnections from being constricted or broken.

Still another object of this invention is to provide an improved method of manufacturing a semiconductor device which permits the formation of fine openings by self-alignment and which sharply enhances the density of integration.

Yet another object of this invention is to provide an improved method of manufacturing a semiconductor device which reduces the capacitance between a gate electrode and a source or drain electrode, thus making high speed operation possible.

Further objects of this invention will become apparent from the following detailed description taken with reference to the drawings illustrative of the preferred embodiments.

BRIEF DESCRIPTION OF THE DRAWINGS

FIG. 3 is a plan view showing the state of the Al interconnection, FIGS. 4(a) to 4(d) are vertical sectional views of a semi-conductor wafer during the principal steps of a method embodying this invention, FIGS. 7(a) to 7(i) are vertical sectional views of a semi-conductor wafer during the principal steps of applying this invention to the manufacture of an Al-gate SOS (silicon-on-sapphire) complementary MOS FET, FIGS. 8(a) to 8(e) are vertical sectional views of a C-MOS FET portion during the principal steps of still another embodiment of this invention.

DETAILED DESCRIPTION OF THE PREFERRED EMBODIMENTS

Figure 1A:
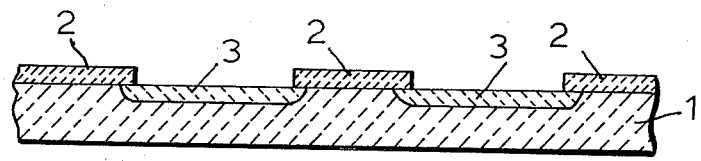
FIGS. 1(a) to 1(c) are vertical sectional views of a semi-conductor wafer during the principal steps of a prior-art method.

Hereunder, this invention will be disclosed by explaining the preferred embodiments.

FIGS. 4(a) to 4(d) are vertical sectional views which show a part of a semi-conductor wafer during the essential steps of manufacture of a P-channel Al-gate MOS FET according to an embodiment of the method of this invention.

As shown in FIG. 4(a), a film 10 which is simply a silicon nitride film ($Si_3N_4$ film) or an $Si_3N_4$ film which has an $SiO_2$ film as an underlying film is formed at a predetermined position on a silicon substrate 1 of the N-conductivity type. The resultant substrate is heated in wet oxygen at 950° C. for about 20 hours, to form a selective oxidation film 11 having a thickness of approximately 1.5μ. Subsequently, as shown in FIG. 4(b), the film 10 is selectively removed so as to leave a part 10A covering a portion which is to become a channel region and parts 10B and 10C covering portions which are to become openings for contact of Al interconnections. The selective removal of the film 10 made of the $Si_3N_4$ film is conveniently performed in a plasma of carbon tetrafluoride ($CF_4$) gas by employing a photoresist film as a mask. Subsequently, using the remaining parts of film 10 and the selective oxidation film 11 as a mask, boron is diffused into the substrate by employing boron tribromide ($BBr_3$), diborane ($B_2H_6$) or the like as an impurity source. Thus, source and drain regions 3 of the P-conductivity type are formed. At this time, the width W of the film 10 which covers the portion which is to become the contact opening and the depth $X_j$ of the diffusion for the source of drain region 3 must keep the following relation therebetween:

$$W < 2X_j$$

Unless this relation is kept, the N-type silicon substrate 1 is exposed under the contact opening, and hence, the exposed part needs to be turned into the P-conductivity type. Subsequently, as shown in FIG. 4(c), a selective oxidation film 12 is formed in the openings for the source and drain by employing the remaining film 10 as a mask. Thereafter, as shown in FIG. 4(d), the film 10 is removed, and a gate insulating film 7 is deposited on that part of the silicon substrate 1 which is to become a gate region. Subsequently, Al is deposited on the gate insulating film 7, the openings for contact with the source and drain regions 3, and the selective oxidation films 11 and 12, and the Al is patterned into a required shape, to form the Al interconnections 8. Thus, the semiconductor wafer with the P-channel Al-gate MOS FET made according to the method of this invention is finished.

Figure 5:
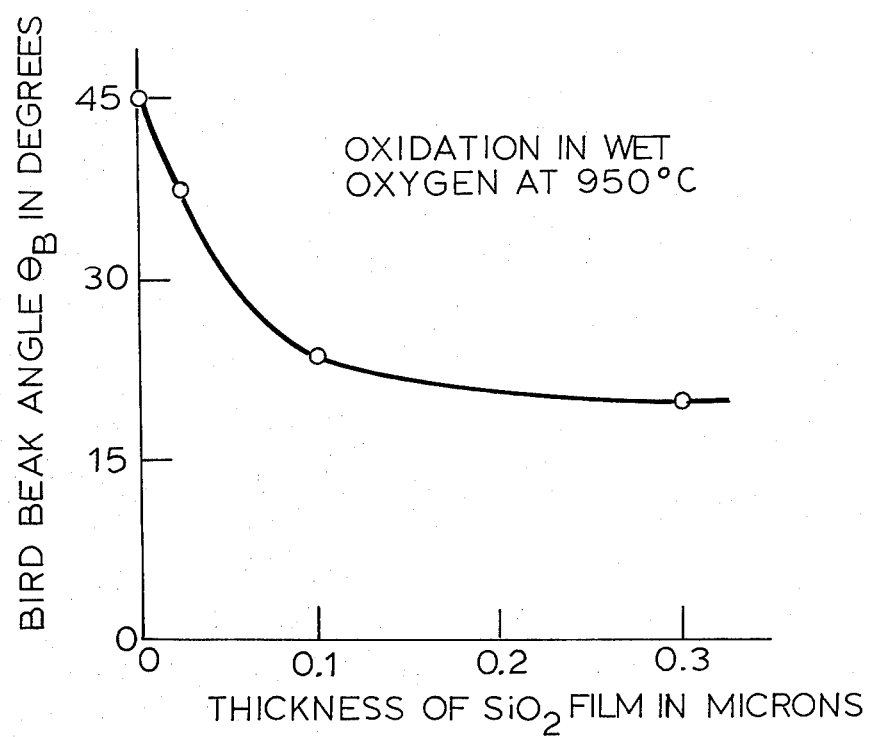
FIG. 5 is a graph showing the relationship between the bird beak angle $\theta_B$ and the thickness of an underlying SiO$_2$ film.

The great difference between the above described method of this invention and the prior-art method resides in the shape of the end part of the selective oxidation film 12 facing the opening. This end part, usually called the bird beak, has a gentle slope, and the angle $\theta_B$ indicated in FIG. 4(c) depends, in general, on the oxidizing temperature and the thickness of the underlying $SiO_2$ film constituting the film 10. FIG. 5 is a graph showing the relationship between the angle $\theta_B$ of the selective oxidation film 12 formed in wet oxygen at 950° C. and the thickness of the underlying $SiO_2$ film. It will be understood from FIG. 5 that the angle $\theta_B$ varies depending on the thickness of the underlying $SiO_2$ film. In this manner, the end part of the selective oxidation film 12 which faces the opening is given a gentle inclination, so that the Al interconnections 8 do not become broken during vacuum evaporation or during the formation of the pattern.

Figure 1B:
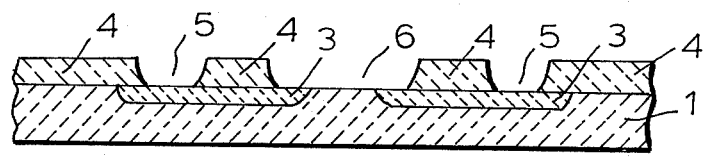

Another great advantage of this invention is that small openings can be obtained. This is due to the method of forming the photoresist film for the selective removal of the film 10 shown in FIG. 4(a). In general, when forming a pattern of specified dimensions in a photoresist film, the pattern can be made finer more easily by leaving parts of the photoresist film corresponding to the pattern forming openings in the photoresist film. In the method of this invention, to the end of selectively leaving the film 10 at the parts at which the openings are to be formed as illustrated in FIG. 4(b), the photoresist film overlying the film 10 which is to remain may be left. In contrast, in the prior art method, for forming the contact openings 5 in the $SiO_2$ film 4 as illustrated in FIG. 1(b), the photoresist film overlying the parts of the $SiO_2$ film 4 to be selectively removed must have openings formed therein. Accordingly, openings of a finer pattern can be formed in the $SiO_2$ film by the method this invention.

Figure 6A:
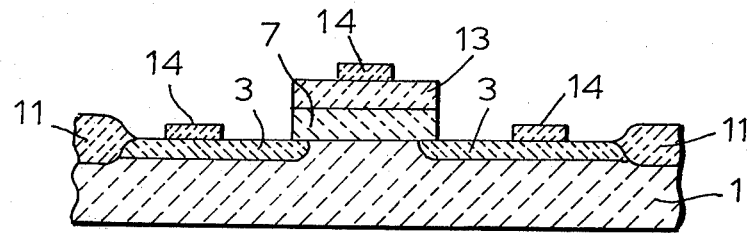
FIGS. 6(a) and 6(b) are vertical sectional views of a semi-conductor wafer during intermediate steps of a method of another embodiment of this invention.
Figure 6B:
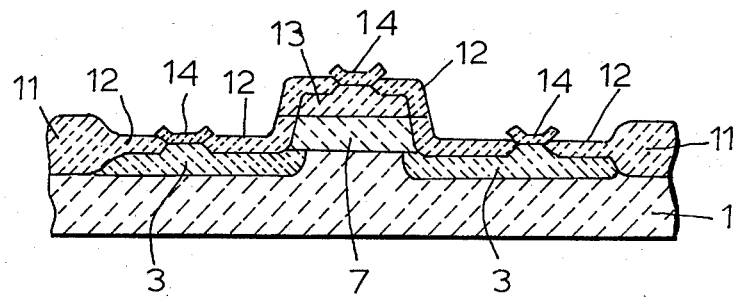

FIGS. 6(a) and 6(b) are vertical sectional views which show a part of a semi-conductor wafer at the intermediate steps of a method according to another embodiment of this invention. Whereas the methods illustrated in FIGS. 1(a)–1(c) and FIGS. 4(a)–4(d) are processes for manufacturing Al-gate P-channel MOS FET's, FIGS. 6(a)–6(b) illustrate a process for manufacturing a silicon (Si)-gate P-channel MOS FET.

First, as explained with reference to FIG. 4(a), a film 10 which is entirely made of $Si_3N_4$ or which is made of an $Si_3N_4$ film underlaid with an $SiO_2$ film is formed at a predetermined position on an n-conductivity type silicon substrate 1. Using the film 10 as a mask, the silicon substrate 1 is oxidized to form a selective oxidation film 11. Subsequently, the film 10 is completely removed, and a gate insulating film 7 as well as a polycrystalline silicon layer 13 is formed at a selected area of the exposed surface of the silicon substrate 1 as shown in FIG. 6(a). Further, using $BBr_3$ or $B_2H_6$ as an impurity source, the polycrystalline silicon layer 13 is turned into a P-conductivity type, and simultaneously, source and drain regions 3 are formed in surface portions of the silicon substrate 1. Subsequently, a film 14 which is entirely made of $Si_3N_4$ or which is made of an $Si_3N_4$ film underlaid with an $SiO_2$ film is selectively formed on those portions of the surfaces of the source and drain regions 3 and the polycrystalline silicon layer 13 at which openings for contact with the source and drain regions and the polycrystalline layer are to be formed. At the next step, as shown in FIG. 6(b), a selective oxidation film 12 is formed by employing the film 14 as a mask. Also in this case, those end parts of the selective oxidation film 12 which face the openings formed in this film 12 have a gentle inclination. Thereafter, in the same way as in FIG. 4(d), the selective oxidation film 14 is removed, and metallic interconnections are formed in a predetermined pattern. Thus, the semiconductor wafer of the Si-gate P-channel MOS FET is completed.

The foregoing two embodiments have been described as carrying out selective oxidation in wet oxygen at 950° C. by employing the $Si_3N_4$ film as the mask. When a high-temperature oxidation technique is used, a film made of a high-melting metal such as platinum (Pt), tungsten (W) or titanium (Ti) can be employed as the masking film instead of the $Si_3N_4$ film. In this case, the film made of the high-melting metal need not be always removed after the selective oxidation, but it can be utilized as a metal layer for contact with the source or drain region or the polycrystalline silicon layer.

FIGS. 7(a) to 7(i) illustrate a case where this invention is used in a process for manufacturing an Al-gate SOS C-MOS IC. This process will be explained in the order of the steps thereof.

Figure 7A:
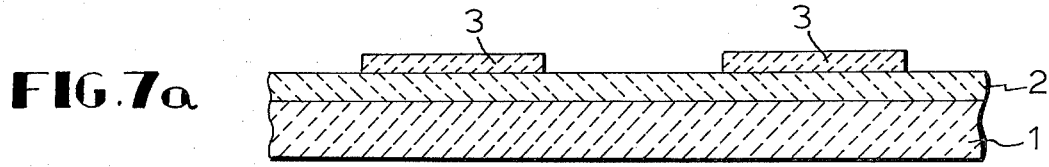
Figure 7B:
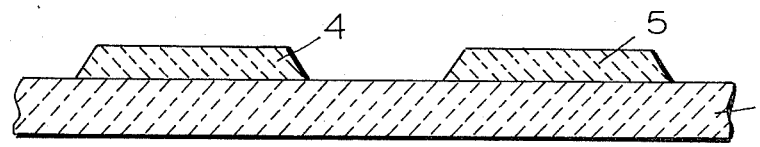
Figure 7C:
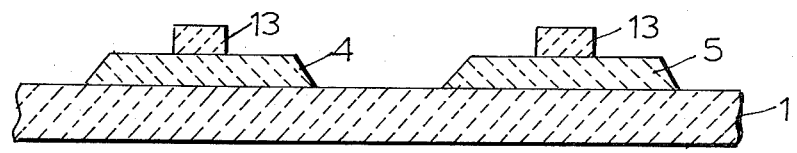
Figure 7D:
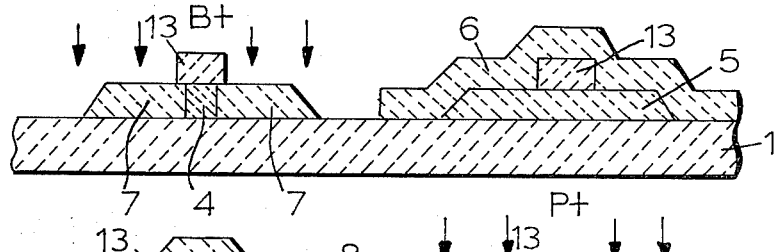
Figure 7E:
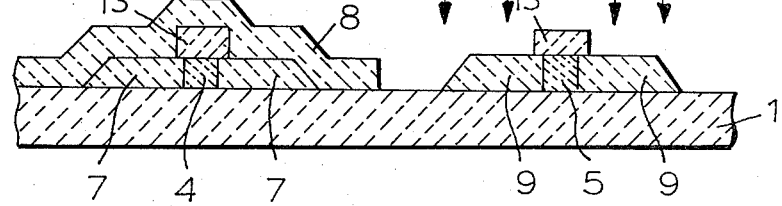
Figure 7F:
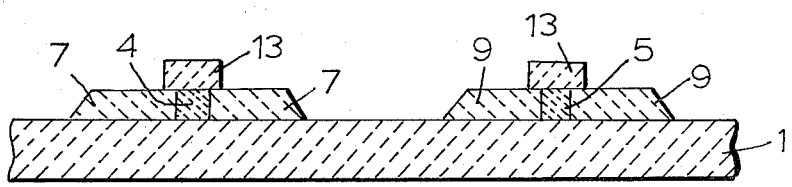
Figure 7G:
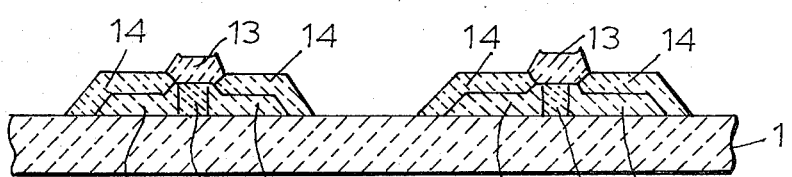
Figure 7H:
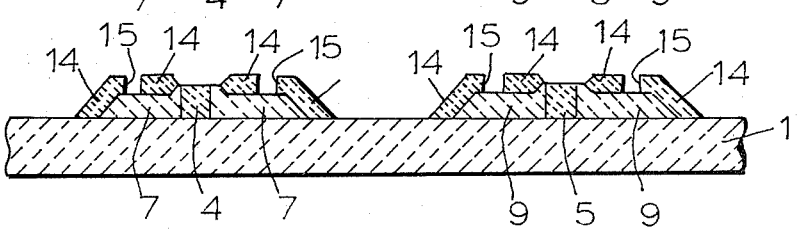

As shown in FIG. 7(a), a Si grown layer 2 with an orientation (1 0 0) is formed on a sapphire substrate 1 by epitaxial growth, and a silicon dioxide film ($SiO_2$ film) 3 is formed on selected areas of the surface of the Si grown layer 2 to a thickness of 500–1,000 Å. Subsequently, as shown in FIG. 7(b), Si islands 4 and 5 are formed by using the $SiO_2$ film 3 as a mask and etching the Si grown layer 2 by anisotropic etching in a mixed etchant containing, e.g., KOH, whereby the etched surface becomes the (1 1 1) face. Layer 2 from which island 4 is formed can be of an N-type conductivity, or it can be doped with an N-type conductivity impurity. The Si island 5 is doped with a P-type conductivity impurity. Subsequently, as shown in FIG. 7(c), a film for acting as a mask 13 which is entirely made of a silicon nitride ($Si_3N_4$) or which is made of an $Si_3N_4$ film underlaid with an $SiO_2$ film is formed on selected areas so as to cover the region of the Si island 4 which is to remain an N-conductivity type and the region of the Si island 5 which is to remain a P-conductivity type. Subsequently, as illustrated in FIG. 7(d), the Si island 5 is covered with a protective film 6, and using the mask film 13 as the mask, the Si island 4 is doped with boron by diffusion or ion implantation, to form source and drain regions 7 of a P-channel FET. In the next step, as illustrated in FIG. 7(e), the protective film 6 is removed, the Si island 4 is covered with a protective film 8, and using the mask film 13 as a mask, the Si island 5 is doped with phosphorus by diffusion or ion implantation, to form source and drain regions 9 of an N-channel FET. The protective film 8 is subsequently removed as shown in FIG. 7(f). Thereafter, as shown in FIG. 7(g), using the mask film 13 as a mask, the exposed parts of the Si island 4 and the Si island 5 are thermally oxidized in an atmosphere containing $H_2O$ or $O_2$, to form field oxide films 14. The openings in the field oxide films 14 are automatically aligned with the channel regions of the P-channel FET and the N-channel FET. In this way, the spacing between the contact openings 15 for the source and drain regions 7 and 9 formed in the field oxide films 14 and the channel regions 4 and 5 (refer to FIG. 7(h)) can.

Figure 8A:
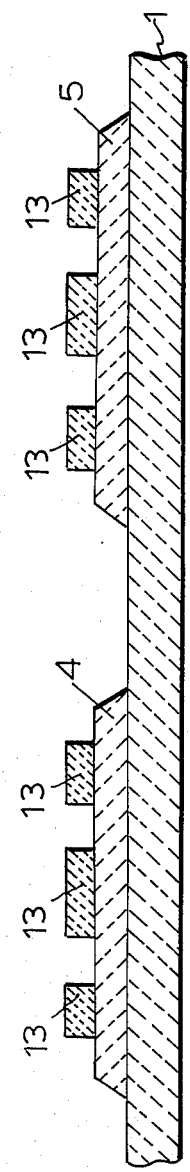
Figure 8B:
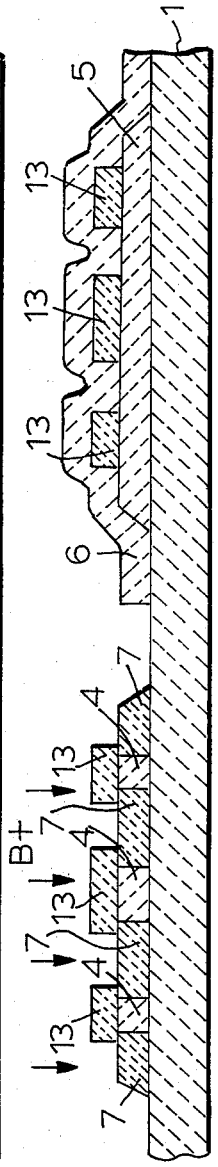
Figure 8C:
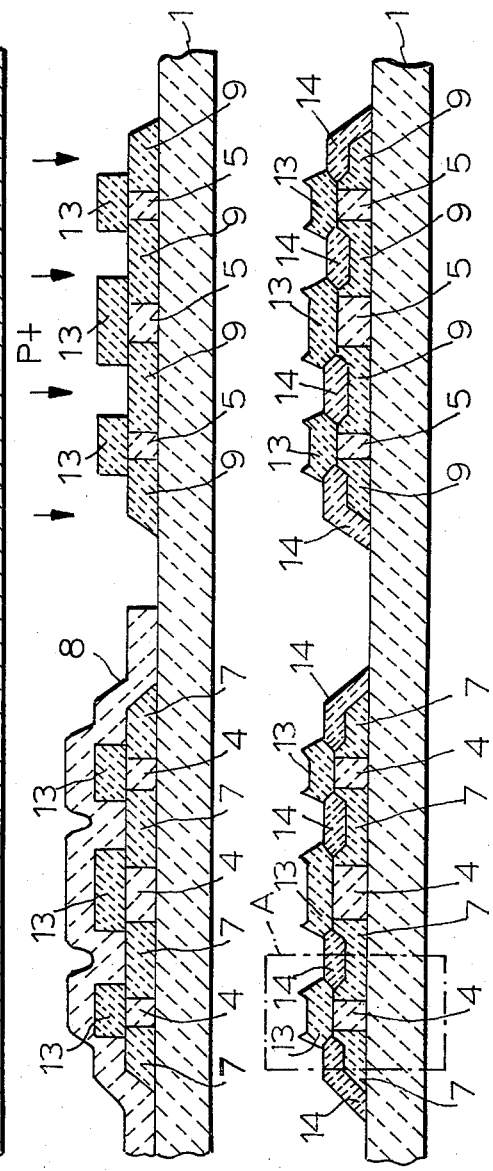
Figure 8D:

A description will now be given of still another embodiment of this invention in which the mutual arrangement of three constituents, namely a channel region, a field oxide film, and contact openings, for source and drain regions provided in the field oxide film are self-aligned. FIGS. 8(a) to 8(e) are vertical sectional views of a single C-MOS FET portion of a wafer during the principal steps of this embodiment, and FIG. 9(a) to 9(d) are vertical sectional views of a metal contact part for a source or drain region of a P-channel FET and the vicinity thereof (the part enclosed by the one-dot chain line in FIG. 8(d)) during the principal steps of the same embodiment. As shown in FIG. 8(a), a film serving as a mask 13 is provided in areas which cover regions of the N-type conductivity Si island 4 and the P-type conductivity Si island 5 formed on a sapphire subtrate 1 which are to remain unchanged and have metallic interconnection-bonding portions formed thereon. Thereafter, as shown in FIG. 8(b), the Si island 5 is covered with a first protective film 6, and using the film 13 as a mask, the Si island 4 is doped with boron by diffusion or ion implantation, to form source and drain regions of a P-channel FET. Subsequently, as illustrated in FIG. 8(c), the protective film 6 is removed, the Si island 4 is covered with a second protective film 8, and using the film 13 as a mask, the Si island 5 is doped with phosphorus by diffusion or ion implantation, to form source and drain regions 9 of an N-channel FET. At the next step, as shown in FIG. 8(d), the protective film 8 is removed, and using the film 13 as a mask, the exposed parts of the Si island 4 and the Si island 5 are thermally oxidized in an atmosphere containing $H_2O$ or $O_2$, to form field oxide films 14. As seen from FIG. 8(d), the openings in the field oxide films are self-aligned with the channel regions and the metallic interconnection-bonding portions for the source and drain regions 7 and 9, of both the P-channel and N-channel FET's. Therefore, the density of the integrated circuit can be greatly enhanced. Mask portion 13 for the gate is removed and a gate oxide film 16 is added in the usual manner, as shown in FIG. 8(e).

Figure 9A:
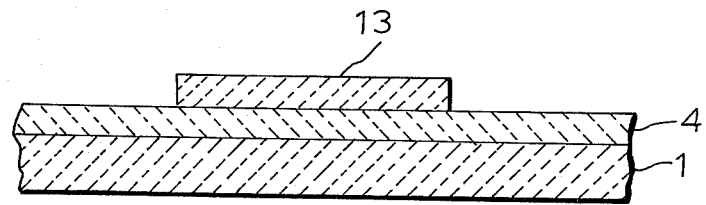
FIGS. 9(a) to 9(d) are vertical sectional views of a metal bonding part for source and drain regions of a P-channel FET made according to the embodiment of FIGS. 8(a) to 8(d).
Figure 9B:
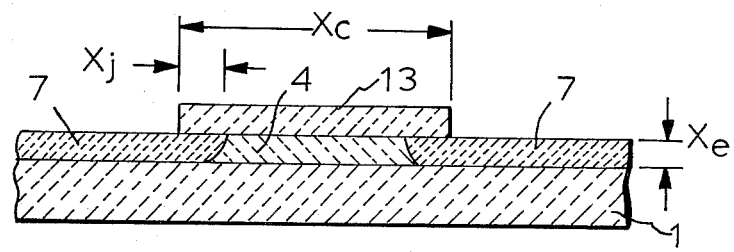
Figure 9C:
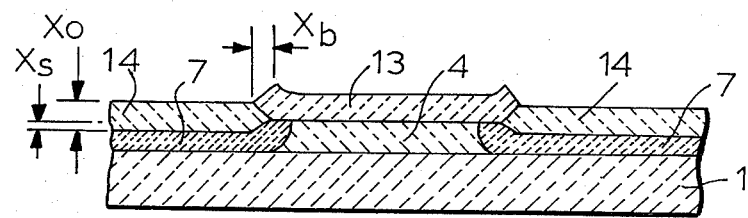
Figure 9D:
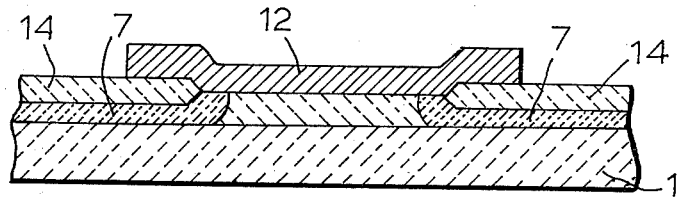

With reference to FIGS. 9(a)–9(d), it will now be described how the bonding of the electrode interconnections to the source and drain regions can be achieved. FIGS. 9(a) and 9(b) correspond to FIGS. 8(a) and 8(b), respectively. $X_j$ in FIG. 9(b) represents the extent of diffusion for forming the source or drain region 7, and it is effective for the performance of this invention to make the extent of diffusion $X_j$ greater than the thickness $X_e$ of the Si epitaxially-grown layer. FIG. 9(c) corresponds to FIG. 8(d). $X_o$ indicates the thickness of the field oxide film 14, and $X_s$ denotes that decrease of the thickness of the Si epitaxially-grown layer which is ascribable to the thermal oxidation. $X_B$ indicates the amount of spreading of the field oxide film 14 towards and under the mask film 13 and being due to the selective oxidation, the spreading usually being termed the bird beak. Ordinarily, the length $X_B$ is equal to or less than the thickness $X_o$. When the mask film 13 is removed with, e.g., the situation becomes as illustrated in FIG. 9(d). As is apparent from FIGS. 9(c) and (d), the condition under which the source or drain region 7 and the Al interconnection 12 are brought into contact in the method of this embodiment is that $X_j - X_B > 0$. Usually, this condition holds good.

Figure 1C:
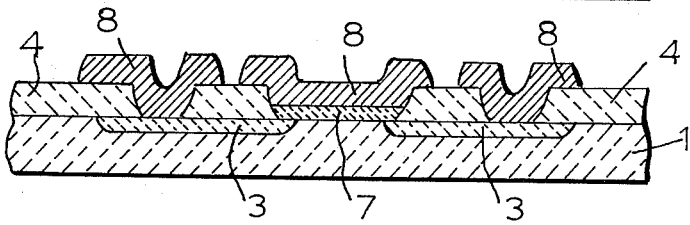
Figure 2A:
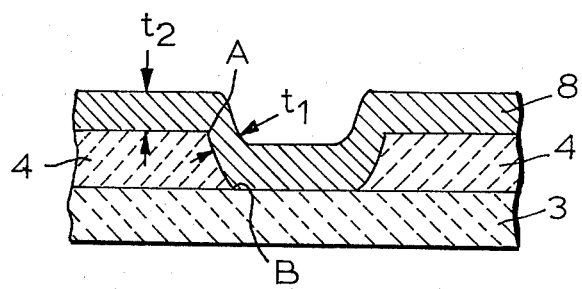
FIGS. 2(a) and 2(b) are enlarged sectional views each showing the state of an Al interconnection.
Figure 2B:
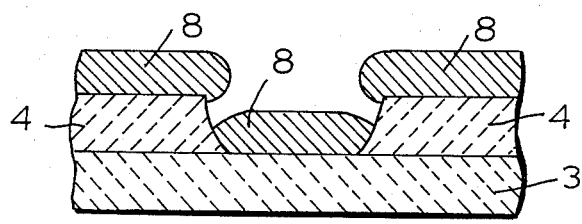

Another great effect of the method of the embodiment illustrated in FIGS. 8(a)–8(d) and FIGS. 9(a)–9(d) is that the end parts of the field oxide film facing the contact openings for the source and drain regions and the channel region form the bird beaks and have a gentle inclination. Unlike the abrupt structure as shown in FIG. 1(c), the structure of this embodiment can substantially reduce the difficulties due to breaks in the electrode interconnections. In the method of the embodiment illustrated in FIGS. 7(a) to 7(h), the channel regions and the openings in the field oxide film are self-aligned, which achieves the effect that the capacitance between a gate electrode and a source or drain electrode can be made small and that the operating speed of the C-MOS IC can be made high.

It has been described above that the first Si island and the second Si island are formed by selectively removing the Si grown layer formed on the sapphire substrate. The first and second Si islands may well be formed by covering the portions of a Si grown layer which are to become the first and second Si islands with an oxidation-proof film, whereupon the Si grown layer can be selectively oxidized.

Although, in the foregoing, there has been described the formation of a C-MOS IC on a substrate of a monocrystalline insulator such as sapphire, this invention is similarly applicable to forming a C-MOS IC on a semiconductor single-crystal substrate such as silicon single-crystal substrate. In this case, however, unless $X_c$ and $X_j$ indicated in FIG. 9($b$) in the third embodiment satisfy the condition of $X_c < 2 X_j$, an impurity needs to be diffused into the region of the Si island 4 underlying the contact opening so that this region will have the same conductivity type as the source or drain region 7. This applies also to the Si island 5.

Further, although an Al-gate C-MOS IC has been used in the examples needless to say the invention is not restricted to such Al-gate devices.

In the foregoing embodiments, there has been described the case where a mere $Si_3N_4$ film or a $Si_3N_4$ film underlaid with the $SiO_2$ film is employed as the mask film. However, the invention is not limited to such a film. In the first embodiment, the mask film may be one the etchant for which etches neither the Si epitaxial layer nor the sapphire substrate and which is not etched by chemicals for removing the protective film. In the embodiments illustrated in FIGS. 7($a$)–7($h$) and FIGS. 8($a$)–8($d$), the mask film may have a resistance to thermal oxidation besides the above properties.

What we claimed is:

1. In a method of manufacturing a complementary MOS integrated circuit device, the steps of forming a first semi-conductor region of a first conductivity type and a second semi-conductor region of a second conductivity type on a substrate of a monocrystalline insulator or on a substrate of a semi-conductor single crystal with said regions isolated from each other, the step of forming a first mask film of a material resistant to thermal oxidation and covering that part of said first semi-conductor region which is to become a channel region and those parts thereof at which metallic interconnections are to be formed, and forming a second mask film of a material resistant to thermal oxidation covering that part of said second semi-conductor region which is to become a channel region and those parts thereof at which metallic interconnections are to be formed, the step of covering said second semi-conductor region with a first protective film and introducing an impurity of said second conductivity type into the unmasked portions of said second semi-conductor region to form source and drain regions therein while leaving channel regions through said first semi-conductor region under the portions of said first mask film, the step of removing said first protective film, covering said first semi-conductor region with a second protective film and introducing an impurity of said first conductivity type into the unmasked portions of said second semi-conductor region to form source and drain regions therein while leaving channel regions through said second semi-conductor region under the portions of said second mask film, the step of removing said second protective film and thermally oxidizing said first and second semi-conductor regions while employing said first and second mask films as masks for forming field oxide films, and the step of removing said first and second mask films for forming contact opening for contacts for said channel regions and said source and drain regions which are automatically aligned with said channel regions and said source and drain regions.

* * * * *